PRINTED CIRCUITS

Filed Aug. 26, 1953

INVENTORS
OTIS D. BLACK AND
RICHARD M. WALSH
BY J. L. Whittaker
ATTORNEY

United States Patent Office 2,758,074

Patented Aug. 7, 1956

2,758,074

PRINTED CIRCUITS

Otis D. Black, Haddon Heights, N. J., and Richard M. Walsh, Philadelphia, Pa., assignors to Radio Corporation of America, a Delaware corporation Application August 26, 1953, Serial No. 376,638

8 Claims. (Cl. 204—15)

This invention relates to improved electrical printed circuits and more particularly to improved printed circuits comprising circuit elements of copper having a surface coating of silver and disposed on an insulating base.

A common method of making printed circuits comprises cementing a relatively thin sheet of copper to a base of Bakelite or other insulating material. A cement commonly used for this purpose comprises a mixture of a polyvinyl butyral thermoplastic resin and phenolic formaldehyde thermosetting resin. This cement has been found to have advantageous electrical properties particularly suitable for printed circuit applications. It also provides a smooth coating and does not tend to produce wrinkles and nodules in a thin copper sheet held by it. The cement is, however, subject to deterioration at temperatures above about 160° to 170° F.

The copper sheet is coated with a photoengraver's resist and a light pattern corresponding to the circuit to be produced is focussed on the surface. The circuit image is developed in the resist to mask selected portions of the copper. Unmasked portions of the copper surface are etched in any convenient solution such as ferric chloride to remove the copper from those portions of the surface not covered by resist material. A circuit comprising copper circuit elements bonded to an insulating surface is thus produced. The resist coating on the copper elements may be removed if desired or may be left on the surface as a permanent protective coating.

It is sometimes desirable to provide a surface of silver over the copper circuit elements of such a printed circuit. For example, when it is desired to make a wiping contact to one or more elements of a printed circuit, it has been found that copper is not a suitable surface contact metal. When exposed to the atmosphere copper corrodes forming a film of copper oxide or copper salts which adversely affects the conductivity of the surface and may impair the effectiveness of a wiping contact.

Since many printed circuits comprise a relatively large number of discrete metallic areas disposed upon an insulating surface, it is relatively difficult to electroplate a coating of silver upon a completely formed printed circuit. To electroplate upon a completed circuit it is necessary to make a separate electrical contact to each of the several discrete portions of the circuit upon which it is desired to plate. This operation is relatively difficult and time consuming. Furthermore, it has not proven practicable to provide a completely uniform electroplated circuit since the electrical leads that must be attached to the individual circuit elements affect the continuity of the plated film.

Accordingly it is an object of the instant invention to provide improved printed circuits.

Another object is to provide improved printed circuits comprising copper circuit elements having an electroplated coating of silver.

A further object is to provide an improved method of making printed circuits having an electroplated coating of silver.

Still another object is to provide an improved method of removing an electroplated coating of silver from a base metal substrate such as copper.

According to the invention an improved printed circuit is provided by a method comprising mounting a sheet of copper upon an insulating base. A relatively thin film of silver is electroplated over the entire exposed surface of the copper sheet. Selected portions of the silver surface are masked and the silver is electrolytically removed from the unmasked portions. Finally, the copper is removed from the unmasked areas by etching.

The invention will be described in greater detail with reference to the drawing of which:

Similar reference characters are applied to similar elements throughout the drawing.

Figure 1:
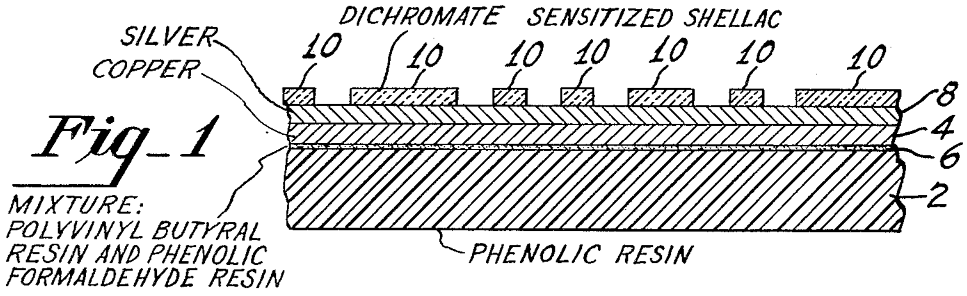
Figures 1–3 are fragmentary, cross-sectional, elevational views illustrating the production of a printed circuit according to the invention.
Figure 2:
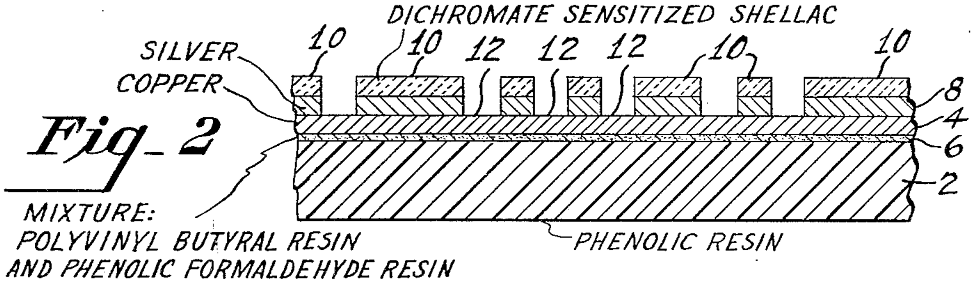
Figure 3:
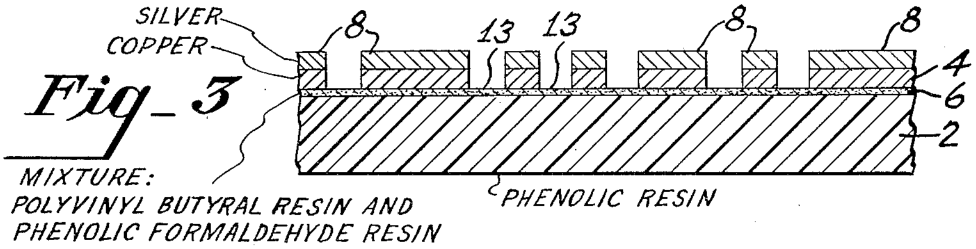

According to a preferred embodiment of the invention, as illustrated in Figures 1–3, a sheet 4 of copper is cemented or otherwise secured, as by a water-resistant adhesive 6, to an insulating base 2. The thickness of the copper sheet is not critical, and may conveniently be about .001″ to .01″. The material of the base is not critical and may conveniently be a laminated phenolic sheet of sufficient thickness to provide any desired degree of rigidity and strength.

The copper surface is immersed in a silver plating bath such as a silver cyanide type bath and a desired thickness, for example, about .0005″, of silver 8 is plated uniformly over the entire surface of the copper. The composition of the bath is not critical; however, the temperature of the bath should not exceed 170° F. when the cement heretofore described is used to bond the copper sheet to the insulating base. If a higher temperature cement is utilized, a higher temperature silver plating solution may also be used.

A coating 10 of a cold-top enamel resist is applied over the silver and a light pattern corresponding to the circuit it is desired to print is projected onto the resist. The light exposure hardens portions 10 of the resist. Unhardened portions are softened in alcohol and washed away in a water bath. The device at this stage of the process is shown in Figure 1.

A suitable resist material is described at page 159 of "Modern Photoengraving" by Flader and Mertle (1948). This resist is made of shellac dissolved in mildly alkaline water, and sensitized with ammonium dichromate.

The surface is immersed in a water solution of sodium thiosulfate and electrolyzed anodically, that is, the silver surface is made anodic with respect to the solution. The concentration of the sodium thiosulfate solution is not critical. Generally any concentration between about 50 and 500 gm. per liter based on anhydrous sodium thiosulfate provides satisfactory results. A concentration between about 150 and 200 gm. per liter is preferred since it allows relatively rapid electrolytic action and a relatively high degree of control. Current densities of up to 20 amperes per square foot of surface area may be utilized. The electrolysis is continued until substantially all the silver is removed from those portions 12 of the surface as shown in Figure 2 not covered with resist.

The surface is cleaned, preferably by scrubbing with a soft brush, to remove deplating residue, and is then etched in an aqueous ferric chloride etching bath of about 35° to 48° Baume. The etching bath etches away the exposed copper from those portions 13 of the surface, as shown in Figure 3, and does not affect the silver. When substantially all the exposed copper is dissolved by the etching solution, the surface is removed from the solution to prevent undercutting, that is, to prevent etching of the copper from beneath the edges of the silver film. The hardened resist film 10 is preferably removed at this point, usually by scrubbing with pumice and a soft brush.

Figure 4:
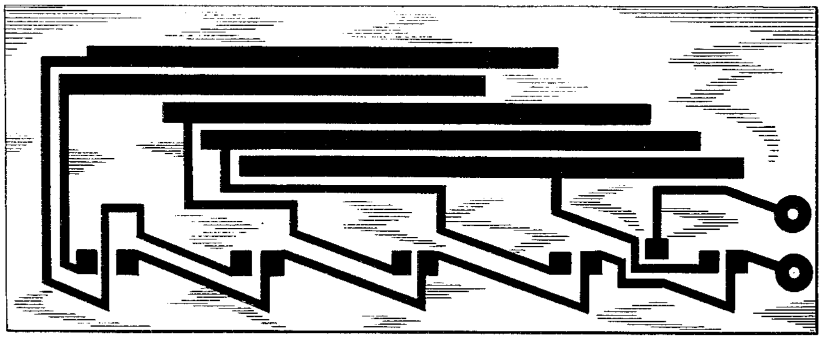
Figure 4 is a plan view of a printed circuit according to the invention.

The surface may be rinsed with water and dried, and is ready to be utilized in a suitable apparatus. A typical circuit is illustrated in Figure 4.

A particular feature of the invention comprises deplating the silver film in a solution of sodium thiosulfate. This solution deplates silver relatively rapidly at relatively low temperatures such as room temperature. It does not build up an undesirable layer of insoluble material on the silver surface being deplated. The advantage of deplating at relatively low temperatures is especially desirable when utilizing the commonly available heat sensitive cements to bond the copper film to the insulating base. Previously known silver deplating solutions either require a relatively high operating temperature which has an adverse effect on the cement or, if utilized at a lower temperature, build up an undesirable insulating layer on the silver surface. Many such previous solutions also attack and remove parts of the hardened resist material.

Another feature of the invention concerns the use of a relatively low temperature resist material such as that commonly known as cold-top enamel which may be cured at a temperature not in excess of 160° F. The sodium thiosulfate solution used for deplating silver has substantially no effect on this resist.

Many other resist materials may be utilized in place of the cold-top enamel described heretofore. Materials such as dichromate sensitized shellac or glue, silver halide photographic gelatin emulsions, or sensitized collodion provide satisfactory results. It is desirable that the resist material not require a high temperature in its development, such as the "burning in" operation utilized in connection with "hot-top" photoengraver's resist. Cold-top enamel is a preferred material since it is relatively inexpensive and is easy to handle and to develop.

In a commercial use of the instant invention dissolved silver in the thiosulfate solution may be readily reclaimed by known chemical methods.

What is claimed is:

1. A method of removing a film of silver from a copper base substrate comprising anodically electrolyzing said film in an aqueous solution consisting essentially of 50 to 500 gm. per liter sodium thiosulfate.

2. The method according to claim 1 in which said solution consists essentially of about 150 to 200 gm. per liter sodium thiosulfate.

3. A method of making an electrical circuit element comprising the steps of: mounting a copper sheet on an insulating base, depositing a film of silver on said sheet, masking portions of said silver film, deplating unmasked portions of said silver film by anodically electrolyzing said film in an aqueous solution consisting essentially of sodium thiosulfate to expose portions of said copper sheet, and removing by etching said exposed portions of said sheet.

4. A method of making a silver pattern on a copper base surface comprising placing a relatively uniform film of silver on said surface, masking portions of said film, and electrolytically removing selected unmasked portions of said film from said surface in an aqueous solution consisting essentially of sodium thiosulfate, said film being made anodic with respect to said solution.

5. The method according to claim 3 in which said masking step comprises coating said silver film with a film of a light-sensitive hardenable material, exposing a selected portion of said light-sensitive film to light thereby to produce a latent image in said sensitive film, developing said latent image by removing unexposed portions of said sensitive film and leaving only said exposed portions on said silver film, thereby to mask portions of said silver film.

6. The method according to claim 5 in which said light-sensitive hardenable material comprises dichromate sensitized shellac.

7. The method according to claim 3 in which said deplating is carried out at a temperature below about 170° F.

8. The method according to claim 4 in which said solution consists essentially of 50 to 500 gm. per liter sodium thiosulfate, and said electrolyzing is carried out at a temperature below about 170° F.

References Cited in the file of this patent

UNITED STATES PATENTS

| | | |
|---|---|---|
| 670,277 | Goodwin | Mar. 19, 1901 |
| 2,066,511 | Arlt | Jan. 5, 1937 |
| 2,441,960 | Eisler | May 25, 1948 |
| 2,506,604 | Lokker et al. | May 9, 1950 |
| 2,602,731 | Nierenberg | July 8, 1952 |
| 2,611,010 | Sass et al. | Sept. 16, 1952 |
| 2,695,351 | Beck | Nov. 23, 1954 |

OTHER REFERENCES

"Silver in Industry," by Addicks (1940), page 390.

Swiggett et al.: Tele-Tech., December 1953, page 78.